(12) United States Patent
Perahia et al.

(10) Patent No.: US 10,696,546 B1
(45) Date of Patent: Jun. 30, 2020

(54) AUXETIC INTERPOSER FOR MICROELECTROMECHANICAL SYSTEMS (MEMS) DEVICE AND MEMS DEVICE PACKAGE INCLUDING THE SAME

(71) Applicant: HRL LABORATORIES, INC., Malibu, CA (US)

(72) Inventors: Raviv Perahia, Agoura Hills, CA (US); David W. Shahan, Los Angeles, CA (US); Christopher P. Henry, Thousand Oaks, CA (US); Hung Nguyen, Los Angeles, CA (US); Logan D. Sorenson, Thousand Oaks, CA (US)

(73) Assignee: HRL Laboratories, LLC, Malibu, CA (US)

( * ) Notice: Subject to any disclaimer, the term of this patent is extended or adjusted under 35 U.S.C. 154(b) by 8 days.

(21) Appl. No.: 16/153,601

(22) Filed: Oct. 5, 2018

Related U.S. Application Data

(60) Provisional application No. 62/596,463, filed on Dec. 8, 2017.

(51) Int. Cl.
| | | |
|---|---|---|
| *B81B 7/00* | (2006.01) | |
| *G01P 1/02* | (2006.01) | |
| *G01P 1/00* | (2006.01) | |

(52) U.S. Cl.
CPC ............ *B81B 7/0058* (2013.01); *G01P 1/023* (2013.01); *B81B 2201/0235* (2013.01); *B81B 2201/0242* (2013.01); *B81B 2207/097* (2013.01); *G01P 1/006* (2013.01)

(58) Field of Classification Search
CPC .......... B81B 7/0058; B81B 2201/0235; B81B 2207/097; B81B 2201/0242; G01P 1/023; G01P 1/006

USPC .......................................................... 257/415
See application file for complete search history.

(56) References Cited

U.S. PATENT DOCUMENTS

| | | | | |
|---|---|---|---|---|
| 7,678,440 | B1* | 3/2010 | McKnight | B32B 3/26 148/563 |
| 9,995,359 | B2* | 6/2018 | Martino Gonzalez | F16F 7/00 |
| 2005/0287371 | A1* | 12/2005 | Chaudhari | B60R 19/18 428/412 |
| 2006/0202492 | A1* | 9/2006 | Barvosa-Carter | B60N 2/42709 293/107 |
| 2011/0059291 | A1* | 3/2011 | Boyce | C08J 5/00 428/136 |
| 2016/0049602 | A1* | 2/2016 | Kim | H01L 51/0097 257/40 |
| 2017/0215284 | A1* | 7/2017 | Ng | B33Y 80/00 |
| 2018/0061743 | A1* | 3/2018 | Hsu | H05K 1/0283 |
| 2018/0244518 | A1* | 8/2018 | Miraglia | B82B 3/0052 |
| 2018/0348025 | A1* | 12/2018 | Jahromi | G01D 21/00 |

OTHER PUBLICATIONS

Shang et al, Durable bistable auxetics made of rigid solids, Invited Article, J. Mater. Res., vol. 33, No. 3, Feb. 14, 2018, © Materials Research Society 2017, pp. 300-308.

* cited by examiner

*Primary Examiner* — Karen Kusumakar
*Assistant Examiner* — Adam S Bowen
(74) *Attorney, Agent, or Firm* — Lewis Roca Rothgerber Christie, LLP

(57) ABSTRACT

An auxetic interposer includes: a frame enclosing an interior space; a pad arranged within the interior space; and a plurality of micro auxetic lattices extending between the frame and the pad.

20 Claims, 14 Drawing Sheets

AUXETIC INTERPOSER FOR MICROELECTROMECHANICAL SYSTEMS (MEMS) DEVICE AND MEMS DEVICE PACKAGE INCLUDING THE SAME

CROSS-REFERENCE TO RELATED APPLICATION

The present application claims priority to and the benefit of U.S. Provisional Patent Application Ser. No. 62/596,463, filed on Dec. 8, 2017, the entire content of which is incorporated herein by reference.

FIELD

One or more aspects of embodiments of the present invention relate to a mechanical interposer having an auxetic structure and a microelectromechanical systems (MEMS) device package including the same.

BACKGROUND

Microelectromechanical systems (MEMS) are a classification of microscopic devices, such as those with moving parts. MEMS devices generally include components having a size in a range of about 1 μm to about 100 μm but are not limited thereto. Generally, MEMS devices have an overall dimension in a range of about 20 μm to about 1 mm, but MEMS devices may have any suitable size as would be understood by those skilled in the art.

Recently, MEMS devices have been used in accelerometers, inertial measurement units (IMUs), gyroscopes, etc. In such applications, accuracy of the MEMS device is important to the overall operation of the device in which they are employed, such as the accelerometer, IMU, gyroscope, etc. Based on the operating environment, the MEMS device may be subjected widely variant thermal environments and relatively strong vibrations. For example, IMUs including MEMS devices may be used on spacecraft, airplanes, automobiles, etc.

It has been found that stress (e.g., thermal stress) may be applied to the MEMS devices due to different thermal expansion coefficients of the components of the MEMS device, the MEMS device packaging, and the MEMS device mounting structures and configuration. Such stress may degrade performance of a MEMS device, thereby negatively impacting the output of the accelerometer, IMU, gyroscope, etc. of which the MEMS device is a component. As such, structures for isolating MEMS devices from thermal and mechanical stress, such as the embodiments described below, are desired.

SUMMARY

Aspects of embodiments of the present invention are directed toward a mechanical interposer having an auxetic structure (referred to herein as an "auxetic interposer") and a MEMS device package including the same. The auxetic interposer may be arranged between a MEMS device and related packaging and/or mounting structures to eliminate or substantially reduce the effect of packing, mounting, and/or thermal stress on the MEMS device as well as to reduce vibrations transmitted to the MEMS device. For example, the auxetic interposer may be configured to have a Poisson ratio that compensates for a difference in thermal expansion coefficients between the MEMS device and the related packaging. By using the auxetic interposer, the MEMS device may relatively freely expand and/or move due to, for example, thermal changes, without any (or without any substantial) stress being imparted thereto by the MEMS device packaging.

According to an embodiment of the present invention, an auxetic interposer includes: a frame enclosing an interior space; a pad arranged within the interior space; and a plurality of micro auxetic lattices extending between the frame and the pad.

The frame may have an open quadrilateral shape.

The pad and the micro auxetic lattices may be spaced from a plane formed by a bottom surface of the frame.

The pad and the micro auxetic lattices may be suspended from interior edges of the frame.

Each of the micro auxetic lattices may include a plurality of unit cells arranged in a matrix. The matrix may be defined by a number of columns extending in a height direction from the pad to the frame and by a number of rows extending in a width direction perpendicular to the height direction, and the number of rows of unit cells may be greater than the number of columns of unit cells.

Each of the unit cells may have a hexagonal shape.

The hexagonal shape may be a bowtie shape having an interior angle in a range of about 10° to about 45°.

A thickness of each of the micro auxetic lattices may be a direction perpendicular to height direction and the width direction may be about 500 μm.

According to an embodiment of the present invention, a microelectromechanical systems (MEMS) device package includes: a package; a lid sealing an opening in the package; a MEMS device in an area between the package and the lid; and an auxetic interposer coupled to both the package and the MEMS device.

The package may be a leadless chip carrier.

The auxetic interposer may include a frame, a pad, and a plurality of micro auxetic lattices coupling the pad to the frame, and the MEMS device may be mounted to the pad.

Each of the micro auxetic lattices may include a plurality of unit cells arranged in a matrix having more rows than columns. The columns may extend in a height direction from the pad to the frame, and the rows may extend in a width direction perpendicular to the height direction.

The frame may be a quadrilateral shape frame, and the micro auxetic lattices may be coupled to respective sides of the frame in a one-to-one configuration.

The auxetic interposer may include a plurality of electrical connections, the package may include a plurality of pads, and the auxetic interposer may be arranged on the pads.

According to an embodiment of the present invention, a system includes a microelectromechanical systems (MEMS) device coupled to an auxetic interposer. The auxetic interposer includes: a frame having a closed periphery; a plurality of micro auxetic lattices coupled to the frame and in the closed periphery; and a pad coupled to the frame via the micro auxetic lattices. The MEMS device being coupled to the pad.

The MEMS device may include an accelerometer.

The micro auxetic lattices may each include a plurality of bowtie-shaped unit cells.

The pad may be suspended above a bottom of the auxetic interposer by the micro auxetic lattices.

Bowtie-shaped unit cells may be arranged in a matrix form having rows extending in a first direction and columns extending in a second direction.

The bowtie-shaped unit cells in one row of the matrix form may be offset with respect to the bowtie-shaped unit cells in an adjacent row of the one row of the matrix form in the first direction.

BRIEF DESCRIPTION OF THE DRAWINGS

These and other aspects and features of the present invention will be further appreciated and better understood with reference to the specification, claims, and appended drawings, in which:

DETAILED DESCRIPTION

The detailed description set forth below in connection with the appended drawings is intended as a description of example embodiments of the present invention and is not intended to represent the only forms in which the present invention may be embodied. The description sets forth aspects and features of the present invention in connection with the illustrated embodiments. It is to be understood, however, that the same or equivalent aspects and features may be accomplished by different embodiments, and such other embodiments are encompassed within the spirit and scope of the present invention. As noted elsewhere herein, like element numbers in the description and the drawings are intended to indicate like elements. Further, descriptions of features, configurations, and/or other aspects within each embodiment should typically be considered as available for other similar features, configurations, and/or aspects in other embodiments.

Figure 1:
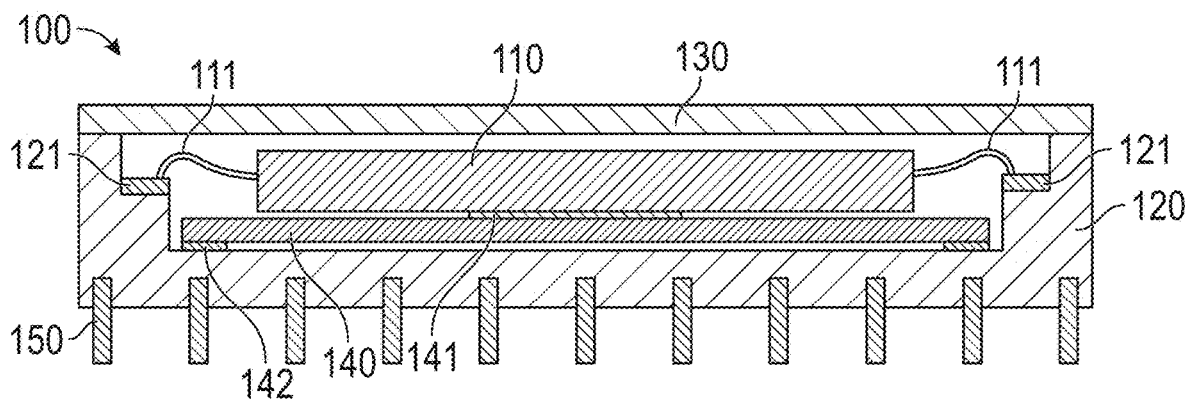
FIGS. 1-5 are cross-sectional views of MEMS device packages according to embodiments of the present invention.

FIGS. 1-5 show MEMS device packages according to embodiments of the present invention. Referring to FIG. 1, a MEMS device package 100 includes a MEMS device (e.g., a MEMS sensor, such as an accelerometer including a MEMS component, an IMU including a MEMS component, a gyroscope including a MEMS component, etc.) 110, a package 120 housing the MEMS device 110, and a lid 130. The package 120 may include a plurality of leads (e.g., pins) 150 for electrical connection to an external device.

The lid 130 may be sealed (e.g., welded) to the package 120 to hermetically seal an area enclosed by the package 120 and the lid 130. Together, the package 120 and the lid 130 may protect the MEMS device 110 from external elements, such as oxygen and moisture, and impacts. The area between the package 120 and the lid 130 may be in a high vacuum state. The package 120 may be only slightly larger than the MEMS device 110. For example, the MEMS device 110 may be about 1 mm away from (e.g., may be spaced about 1 mm from) the inner surface of each of the package 120 and the lid 130. The package 120 may be a chip carrier, such as a ceramic leadless chip carrier (CLCC) including (or made of), for example, alumina, or a plastic leadless chip carrier (PLCC). The package 120 may include a plurality of leads (e.g., pins). In some embodiments, the package 120 may be a 44 pin CLCC. The present invention, however, is not limited to this example.

In the package 120, the MEMS device 110 may be arranged on (e.g., secured to) an auxetic interposer (e.g., a mechanical interposer with an auxetic structure) 140, which will be further described below. A bond layer (e.g., an adhesive layer) 141 may be provided between the auxetic interposer 140 and the MEMS device 110 to secure the MEMS device 110 to the auxetic interposer 140. Further, another bond layer 142 may be provided between the auxetic interposer 140 and the package 120 to secure the auxetic interposer 140 to the package 120.

Electric signals may be sent from and/or received by the MEMS device 110 via wirings 111, which are connected to pads 121 in the package 120. The pads 121 may be electrically connected to the leads 150, and some of the wirings 111 may provide power to the MEMS device 110 from an external power source via the pads 121. In some embodiments (see, e.g., FIGS. 4 and 5), the auxetic interposer may be directly connected to the pads such that the wirings 111 may be omitted.

FIGS. 2-5 show MEMS device packages according to other example embodiments of the present invention. In each of these embodiments, elements or components indicated by the same numeral as those described above with respect to the embodiment shown in FIG. 1 have the same or a substantially similar structure and/or function. For convenience of explanation, different elements, components, and configurations between the embodiment shown in FIG. 1 and the embodiments shown in FIGS. 2-5 will primarily be described below.

Figure 2:
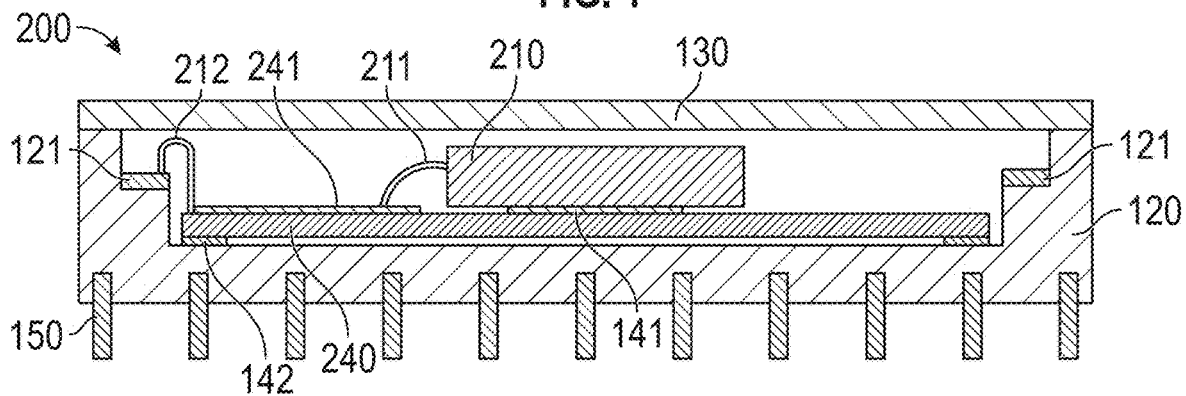

Referring to FIG. 2, a MEMS device package 200 includes a MEMS device 210 and an auxetic interposer 240. The MEMS device 210 may be the same or substantially similar to the MEMS device 110 described above. In this embodiment, the auxetic interposer 240 includes electrical connections (e.g., electrical traces) 241. The electrical connections 241 may be metalized portions of (e.g., metalized traces formed on) the auxetic interposer 240. The MEMS device 210 may be electrically connected to the leads 150 of the package 120 via wirings 211 extending between the MEMS device 210 and the electrical connections 241 and wirings 212 extending between the electrical connections 241 and the pads 121. When the MEMS device 210 is substantially smaller than the auxetic interposer 240, electrically connecting the MEMS device 210 to the pads 121 via the auxetic interposer 240 instead of to the pads 121 via wires may provide a more robust electrical connection by reducing overall wiring length. In some embodiments, both direct wire connections between the MEMS device 210 and the pads 121 of the package 120 (see, e.g., FIG. 1) and electrical connections 241 on the auxetic interposer 240 (see, e.g., FIG. 2) may be used in combination.

Figure 3:
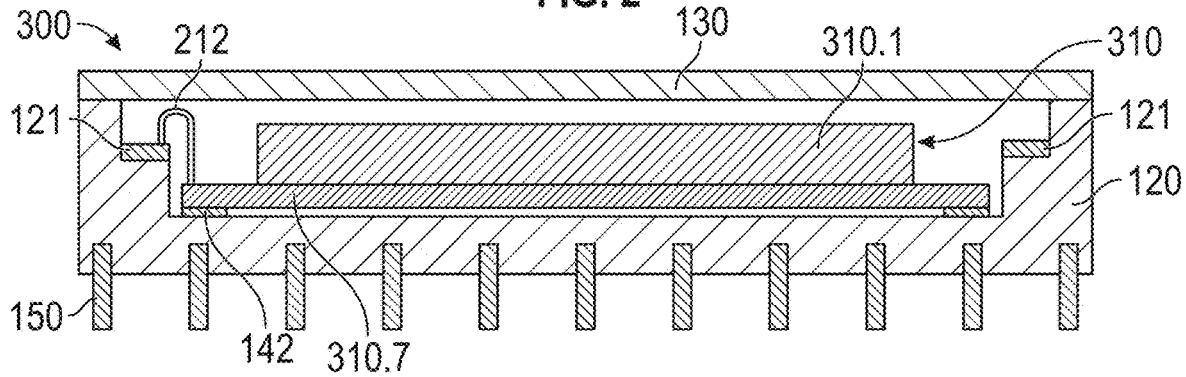

Referring to FIG. 3, a MEMS device package 300 includes an integral MEMS device 310.1 and auxetic interposer 310.2. In this embodiment, the MEMS device 310.1 may be integral with the auxetic interposer 310.2. The auxetic interposer 310.2 may also include electrical connections 241 as described above.

Figure 4:
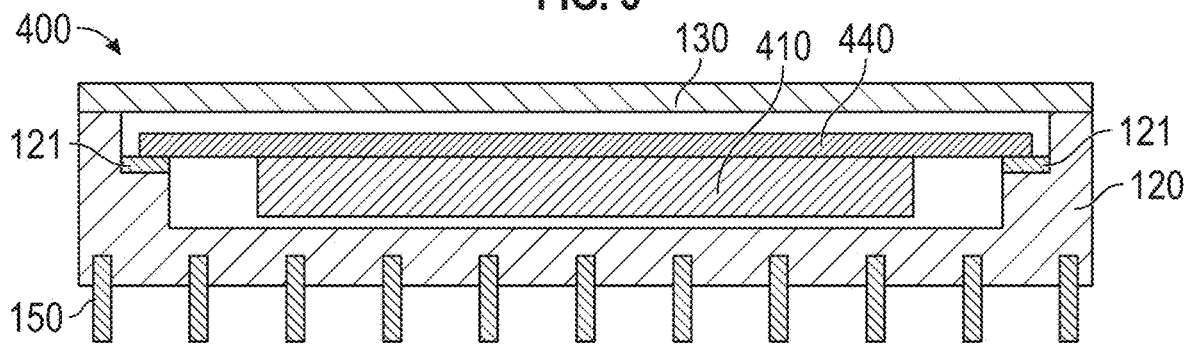

Referring to FIG. 4, a MEMS device package 400 includes a MEMS device 410 arranged below an auxetic interposer 440 with respect to the leads 150. Different from the MEMS device package 100 shown in FIG. 1, in this embodiment the MEMS device 410 is arranged below the auxetic interposer 440, that is, the MEMS device 410 is arranged between the package 120 and the auxetic interposer 440 rather than between the lid 130 and the auxetic interposer 140 as shown in FIG. 1. Further, in this embodiment, the auxetic interposer 440 may be directly connected to the pads 121. Thus, when the auxetic interposer 440 includes electrical connections, similar to the electrical connections 241 described above (see, e.g., FIG. 2), a wiring between the MEMS device 410 and the pads 121 or between the auxetic interposer 440 and the pads 121 may be omitted. For example, all wirings may be omitted from inside the package 120.

Figure 5:
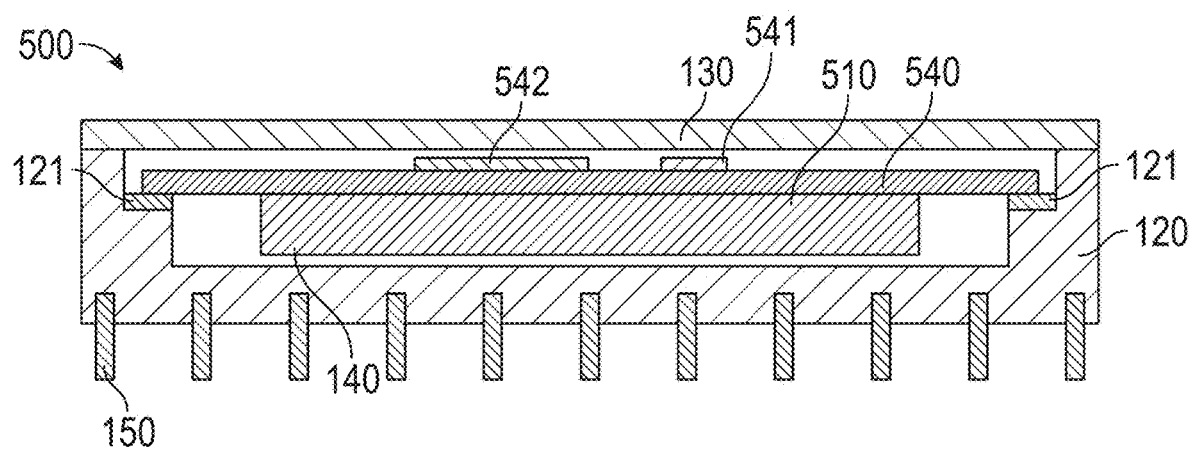

Referring to FIG. 5, a MEMS device package 500 includes a MEMS device 510, an auxetic interposer 540, a thermometer 541, and a heater 542. The thermometer 541 and the heater 542 may operate in conjunction with each other and/or a controller or the like to maintain the auxetic interposer 540 and/or the MEMS device 510 at or above a threshold temperature. In some embodiments, the thermometer 541 may be used to determine when the MEMS device 510 has exceeded a temperature threshold (e.g., too high a temperature or too low a temperature) over which output quality from the MEMS device 510 may be substantially degraded. When the MEMS device 510 is too cold, the heater 542 may be used to heat the MEMS device 510 to be above the temperature threshold.

As would be understood by those of ordinary skill in the art, the various features, aspects, components, arrangements, and configurations described in the embodiments shown in FIGS. 1-5 may be variously mixed and modified between the different embodiments. For example, the arrangement of the MEMS device being between the lid and the auxetic interposer may be combined with the features of the auxetic interposer being directly connected to the pads of the package, etc.

Embodiments of the auxetic interposer will be further described below. Each of the embodiments of the auxetic interposers may be incorporated into any of the above-described embodiments of the MEMS device packages 100, 200, 300, 400, and 500.

An interposer is provided between a MEMS device (e.g., the MEMS device 110, 210, 310, 410, and 510) and a package (e.g., the package 120, which may be, for example, a ceramic leadless chip carrier) to reduce or prevent thermal stress and/or vibration from being transmitted from the package to the MEMS device and vice versa. Thermal stress is often caused by a mismatch between coefficients of thermal expansion of the MEMS device, the package, and a mounting structure onto which the package is mounted, such as a vehicle mounting plate, etc. Vibrations are often imparted to the MEMS device package from the structure on which it is mounted, such as the vehicle.

According to embodiments of the present invention, an auxetic interposer is provided, which reduces or eliminates the imposition of thermal stress onto the MEMS device by including micro auxetic lattices, further described below. For example, the auxetic interposer matches or compensates for a difference in thermal expansion coefficients between the package and the MEMS device such that the MEMS device may freely (or relatively freely) expand without being compressed or pulled by the package or interposer. By allowing free expansion of the MEMS device, the MEMS device is subjected to zero or very little residual stress, thereby improving the quality of the output of the MEMS device. Further, the auxetic interposer rigidly attaches the MEMS device to the package to protect or prevent it from colliding with the package and/or the lid.

Figure 6A:
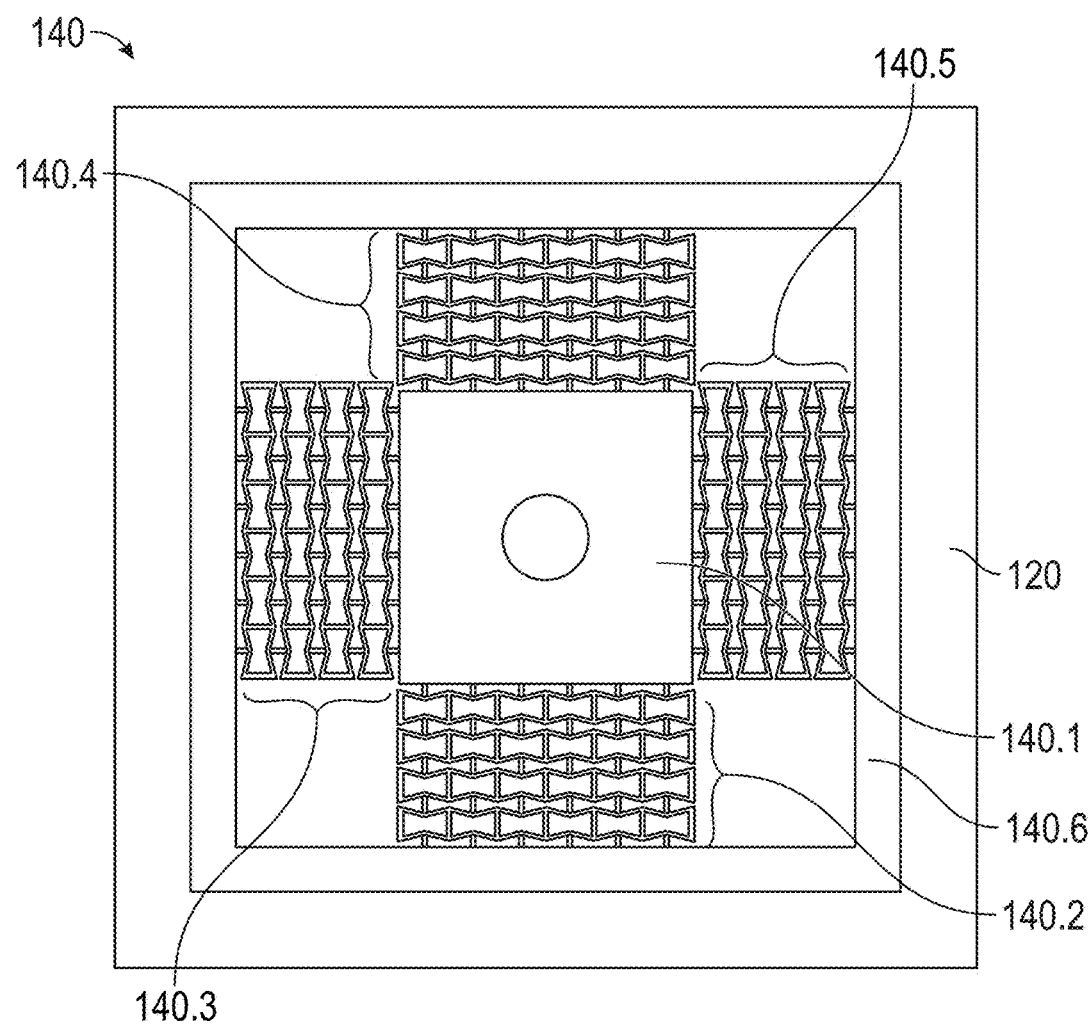
FIGS. 6A and 6B are a plane view and a perspective view, respectively, of an auxetic interposer in a MEMS device package according to an embodiment of the present invention.
Figure 6B:
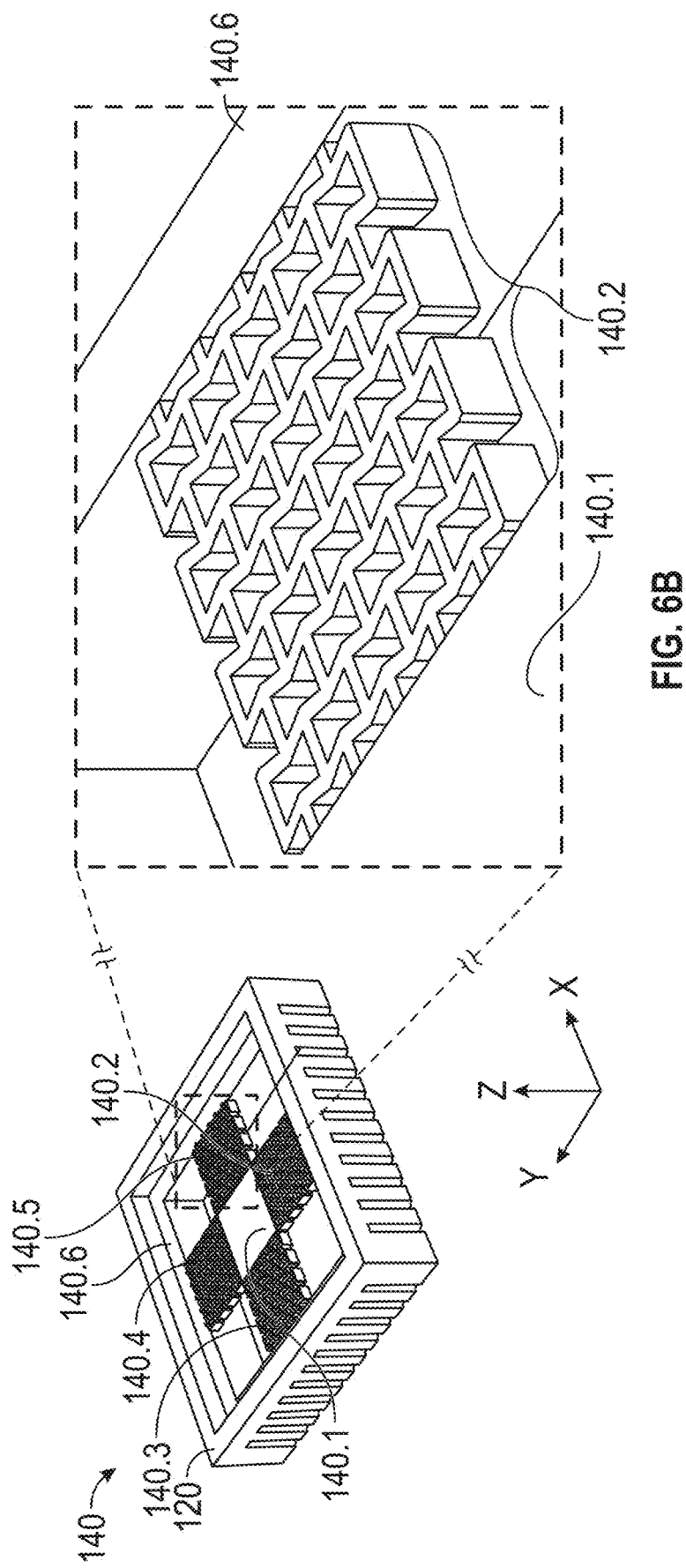

Referring to FIGS. 6A and 6B, the auxetic interposer 140 includes a pad 140.1, a plurality of micro auxetic lattices 140.2-104.5, and a frame 140.6. In FIGS. 6A and 6B, a package 120 is also shown. The auxetic interposer 140 is arranged inside (e.g., fits inside) the package 120 and is suspended above a bottom surface of the package 120, further described below.

The area of the interposer 140 defined within the frame 140.6 may generally be open. For example, the interposer 140 may not have a bottom surface that closes the shape. The MEMS device (e.g., the MEMS device 110, 210, 310, 410, 510) is mounted to the auxetic interposer 140 at the pad 140.1.

The interposer 140 may include (or may be formed of) the same or a substantially similar material as the MEMS device that is mounted on the interposer 140. As some examples, the interposer 140 may include (or may be formed of) a semiconductor material, a metal, and/or a piezoelectric material. As some examples, the interposer 140 may include (or may be formed of) silicon (Si), silicon dioxide ($SiO_2$), silicon nitride ($SiN_x$), silicon carbine (SiC), gallium nitride (GaN), gallium arsenide (GaAs), aluminum (Al), nickel (Ni), gold (Au), aluminum nitride (AlN), borosilicate glass, and/or fused quartz, but the present invention is not limited thereto. When the same material is used for both the interposer 140 and the MEMS device, the interposer 140 and the MEMS device will have the same or substantially similar thermal expansion coefficients, thereby further reducing thermal stress that may be generated in the package 120. When different materials are used for the interposer 140 and the MEMS device, the material of the interposer 140 should have a thermal expansion coefficient between that of the package 120 and the MEMS device. In embodiments in which a heater is included (see, e.g., FIG. 5), a material having relatively low thermal conductivity may be selected for the interposer 140 to reduce heat loss from the MEMS device to the package 120 through the interposer 140. For example, silicon (Si) has relatively high thermal conductivity so it may not be well suited to embodiments in which a heater is included. In such embodiments, the interposer 140 may be made of borosilicate glass, which has a coefficient of thermal expansion that is similar to silicon (Si) but has lower thermal conductivity.

As one example, when the MEMS device includes silicon and the package includes alumina, the interposer may include silicon (e.g., the same as the MEMS device) or borosilicate glass. As another example, when the MEMS device includes fused quartz and the package includes alumina, the interposer may include fused quartz. As yet another example, when the MEMS device includes silicon carbide and the package includes alumina, the interposer may include silicon carbide.

The interposer 140 may be formed from a single wafer. For example, the pad 140.1, the micro auxetic lattices 140.2-140.5, and the frame 140.6 may be integral with each other. In some embodiments, the interposer 140 may be formed by etching, laser cutting, ultrasonic machining, and/or three-dimensional printing. To facilitate easier manufacturing, the micro auxetic lattices may be planar structures such that a top-down manufacturing process, such as etching, laser cutting, ultrasonic machining, etc. may be used to form the interposer. In other embodiments, the micro auxetic lattices may be have three-dimensional features (e.g., may not be able to be formed in a single top-down manufacturing process), and in such embodiments, three-dimensional printing, additive manufacturing, or the like may be used.

The micro auxetic lattices 140.2-140.5 extend between the pad 140.1 and the frame 140.6. For example, the micro auxetic lattices 140.2-140.5 extend between the pad 140.1 and the frame 140.6. The pad 140.1 and the micro auxetic lattices 140.2-140.5 may be above (e.g., suspended above or spaced from) a bottom of the auxetic interposer 140 and/or a bottom of the package 120. For example, the pad 140.1 and the micro auxetic lattices 140.2-140.5 may only be connected to the frame 140.6 of the auxetic interposer 140, and the auxetic interposer 140 may have an open bottom exposing the package 120. In some embodiments, the auxetic interposer 140 may have a bottom surface, but even in these embodiments, the pad 140.1 and micro auxetic lattices 140.2-140.5 may be spaced above and not directly connected to the bottom surface of the auxetic interposer 140. By being spaced from (e.g., not directly connected to) the package 120 and/or a bottom surface of the auxetic interposer 140, the pad 140.1 and micro auxetic lattices 140.2-140.5 are allowed to freely move due to thermal changes as further described below.

Figure 7:
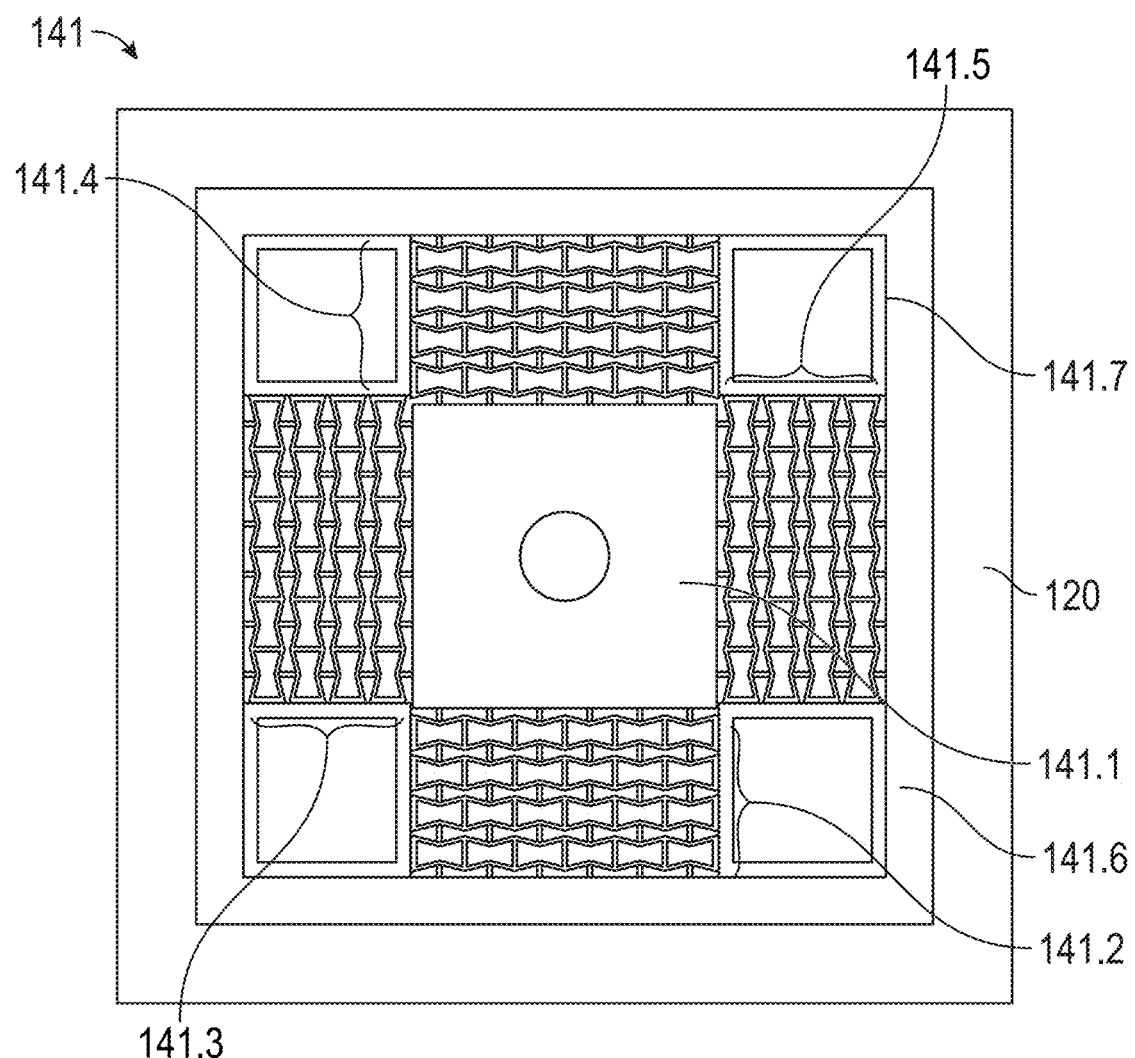
FIG. 7 is a plane view of an auxetic interposer in a MEMS device package according to an embodiment of the present invention.

In FIGS. 6A and 6B, the auxetic interposer 140 has a quadrilateral (e.g., a rectangular or square) frame 140.6 with four micro auxetic lattices 140.2-140.5, but the present invention is not limited thereto. For example, in FIG. 7, an auxetic interposer 141 is shown. Similar to the auxetic interposer 140 shown in FIGS. 6A and 6B, the auxetic interposer 141 includes a pad 141.1, a plurality of micro auxetic lattices 141.2-141.5, and the frame 141.6 but further includes solid corners 141.7 extending between the sides of the auxetic lattices 141.2-141.5 and the frame 141.6. By including the solid corners 141.7, the stiffness of the auxetic interposer 141 may be increased when compared to the auxetic interposer 140 shown in FIGS. 6A and 6B.

In other embodiments, the auxetic interposer may have a circular frame and/or a triangular frame with different numbers of micro auxetic lattices. For example, an embodiment in which the auxetic interposer has a triangular frame may include three micro auxetic lattices, one extending from each of the three sides of the triangular frame. Other shapes are similarly considered and are to be part of this disclosure.

The micro auxetic lattices 140.2-140.5 are geometric metamaterials and have zero or negative Poisson's ratios. The Poisson's ratio of the micro auxetic lattices 140.2-140.5 may be individually configured by modifying the geometric characteristics of the individual lattices, as further described below. The Poisson's ratio of the micro auxetic lattices 140.2-140.5 may be configured to match or be halfway between the thermal expansion coefficients of the package 120 and/or the MEMS device 110 to act as a buffer between the different thermal expansion coefficients of these components. In some embodiments, the micro auxetic lattices 140.2-140.5 may be configured to match anisotropic thermal expansion coefficients by considering the crystal direction of the micro auxetic lattices 140.2-140.5. In FIGS. 6A and 6B, the micro auxetic lattices 140.2-140.5 have honeycomb structures formed of a plurality of unit cells, and each unit cell has a hexagonal shape (e.g., a bowtie or hourglass shape). The present invention, however, is not limited thereto.

Figure 8:
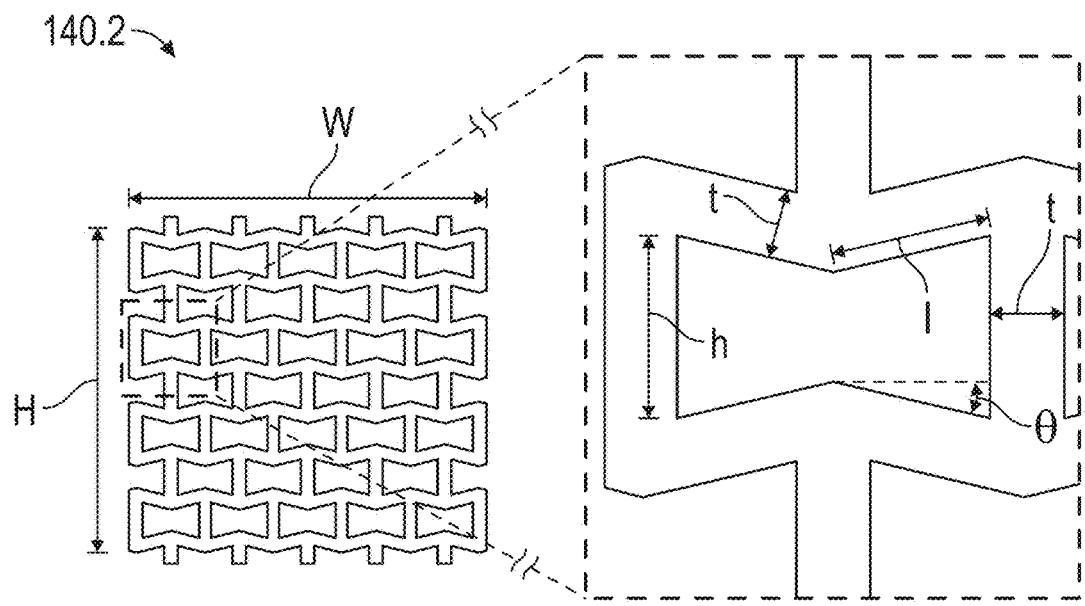
FIG. 8 is a plane view of a micro auxetic lattice of the auxetic interposer shown in FIGS. 6A and 6B.

Referring to FIG. 8, the micro auxetic lattice 140.2 has a height (H) in a direction from the frame 140.6 to the pad 140.1 and a width (W) in a direction crossing (e.g., perpendicular to) the height direction and includes a plurality of unit cells. The unit cells are arranged in a matrix shape having M rows extending in the width direction and N columns extending in the height direction. In the embodiment shown in FIG. 8, the micro auxetic lattice 140.2 has a 7×5 configuration (i.e., 7 rows of unit cells and 5 columns of unit cells), but the present invention is not limited thereto. As other examples, any combination of rows and columns between 4×4-7×7 are also considered (see, e.g., FIGS. 11A-13B). Typically, the number of rows is within two of the number of columns (e.g., the number of rows is typically the number of columns plus/minus two), but the present invention is not limited to these examples either.

Each of the unit cells is defined by its height (h), leg length (l), in-plane wall thickness (t), interior angle (A), and out-of-plane thickness. The out-of-plane thickness may be considered the thickness of the micro auxetic lattice 140.2 generally. The out-of-plane thickness affects the out-of-plane resonant frequency of the interposer, and the thickness should be set such that the out-of-plane resonant frequency is greater than about 2 kHz.

In some embodiments, the in-plane wall thickness (t) may be in a range of about 165 μm to about 175 μm, and the out-of-plane thickness may be about 500 μm.

In some embodiments, the various dimensions may be determined according to the following Equations 1 and 2.

$$h = \frac{[H + (M+1)*l*\sin(\theta) - (M+1)*\frac{t}{\cos(\theta)} - (M+1)*\frac{t}{2}*\tan(\theta)]}{M+1} \quad \text{Equation 1}$$

$$l = \frac{[W - (N+1)*t]}{N*2*\cos(\theta)} \quad \text{Equation 2}$$

In Equations 1 and 2, generally, the in-plane wall thickness (t) must be greater than $$\frac{W}{(N+1)}$$

and also great than $$\frac{H}{(M+1)}$$

to provide a valid result.

Figure 9A:
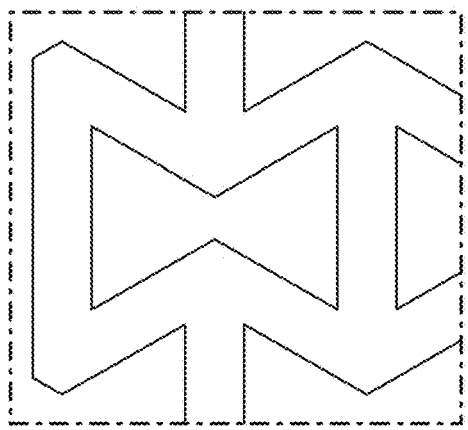
FIGS. 9A-9D show an auxetic unit cell of the micro auxetic lattice shown in FIG. 8 according to embodiments of the present invention.
Figure 9B:
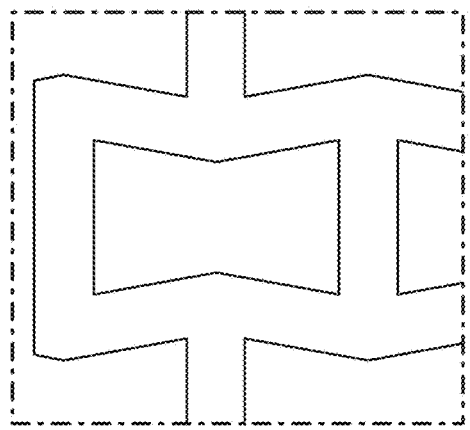
Figure 9C:
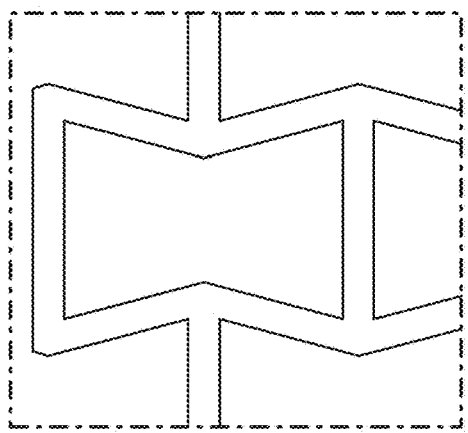
Figure 9D:
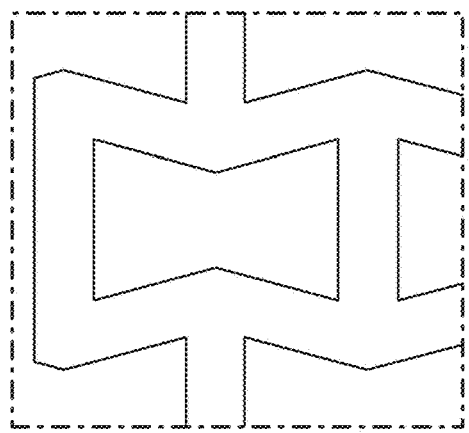
Figure 10A:
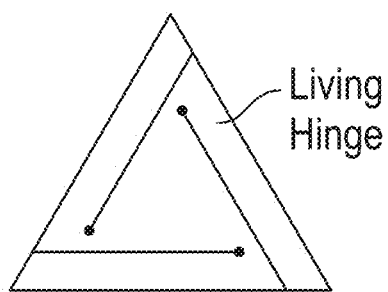
FIGS. 10A-10F show different auxetic unit cell structures.
Figure 10B:
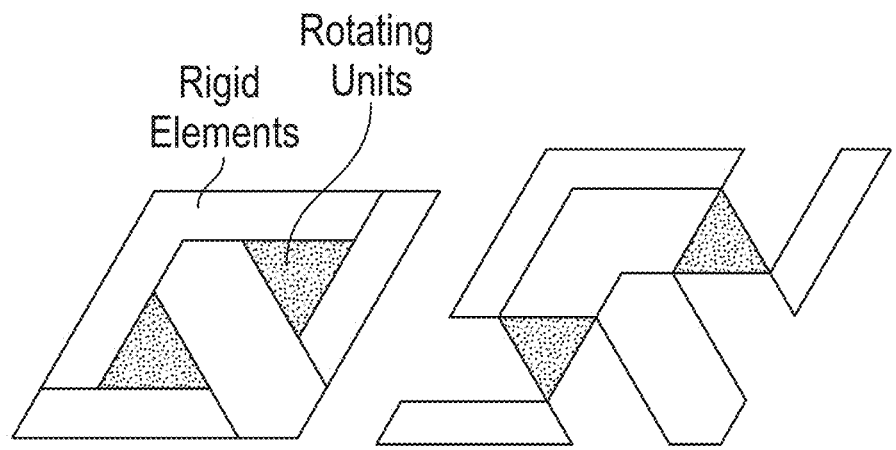
Figure 10C:
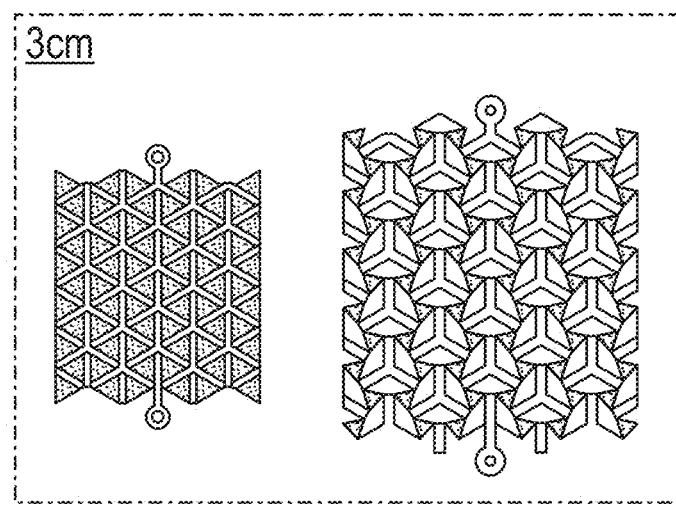
Figure 10D:
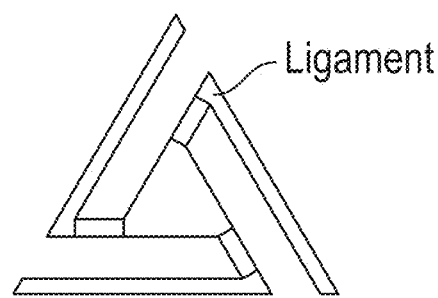
Figure 10E:
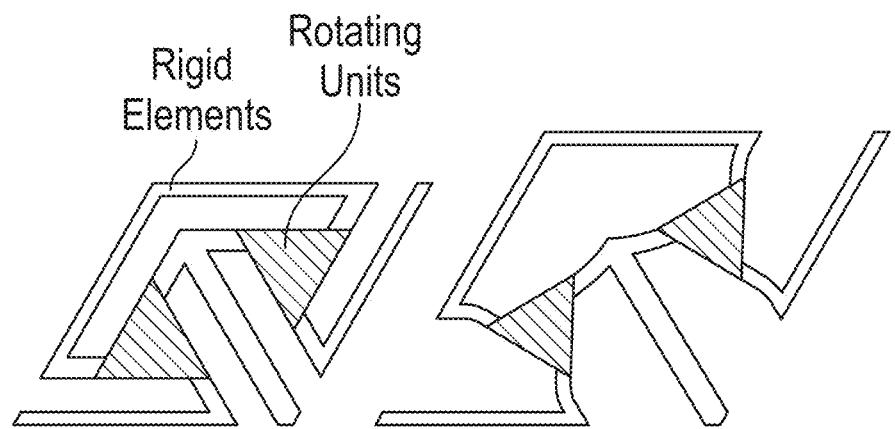
Figure 10F:
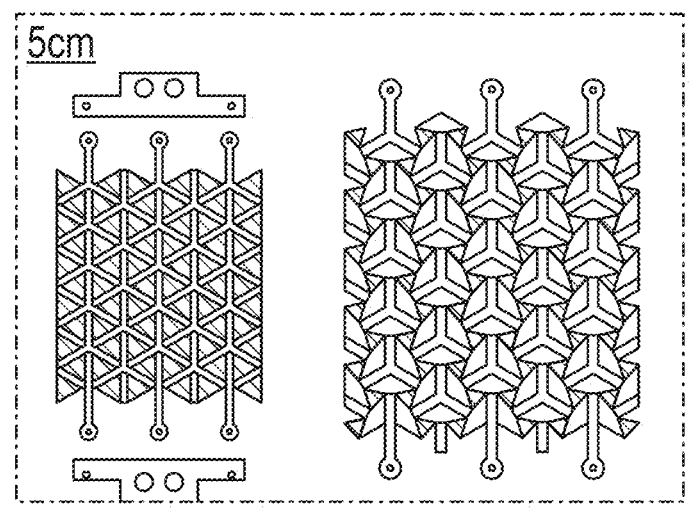

Variations of the unit cell dimensions are shown in FIGS. 9A-9D. FIGS. 9A and 9B show a variation in interior angle (θ) from about 30° in FIG. 9A to about 10° in FIG. 9B. FIGS. 9C and 9D show a variation in in-plane thickness (t) from about 80 μm in FIG. 9C to about 150 μm in FIG. 9D.

FIGS. 10A-10F show different auxetic unit cell structures. These different auxetic unit cell structures may include rigid members or elements and hinges between the stationary elements. In these embodiments, the hinges allow the rigid members to move as the temperature of the auxetic unit cell structures changes.

Figure 11A:
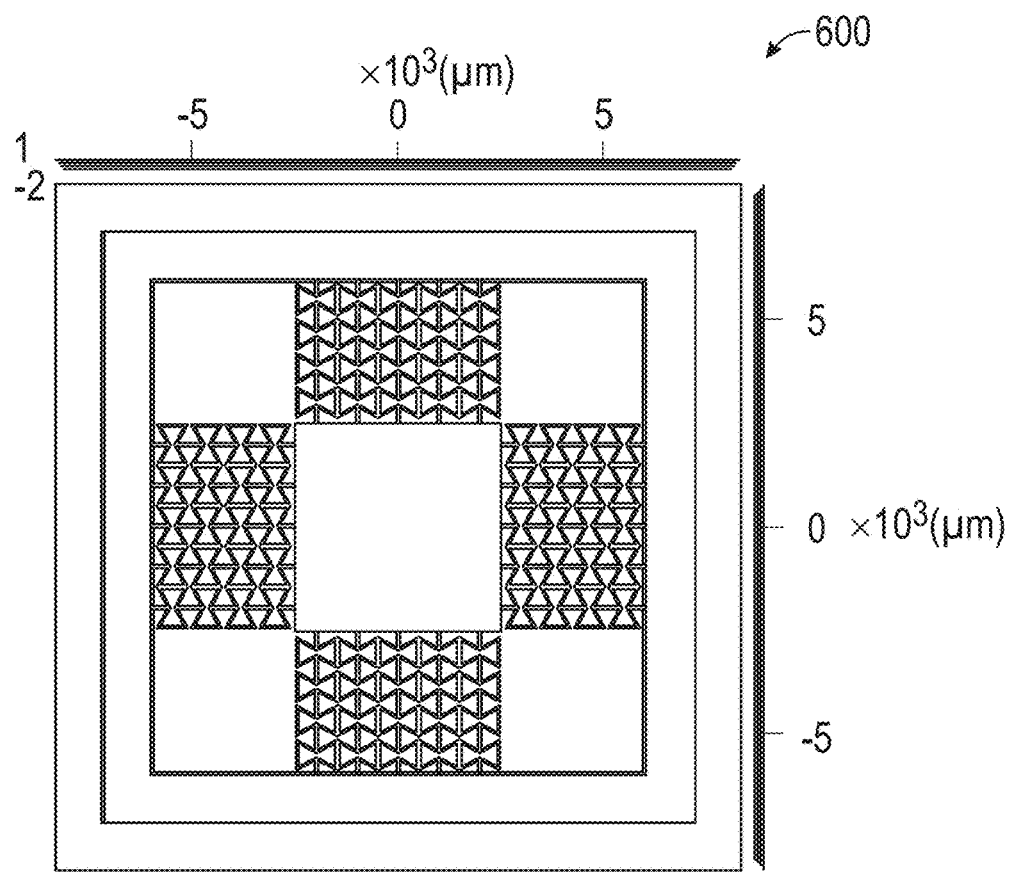
FIGS. 11A and 11B show an auxetic interposer in a MEMS device package according to an embodiment of the present invention.
Figure 11B:
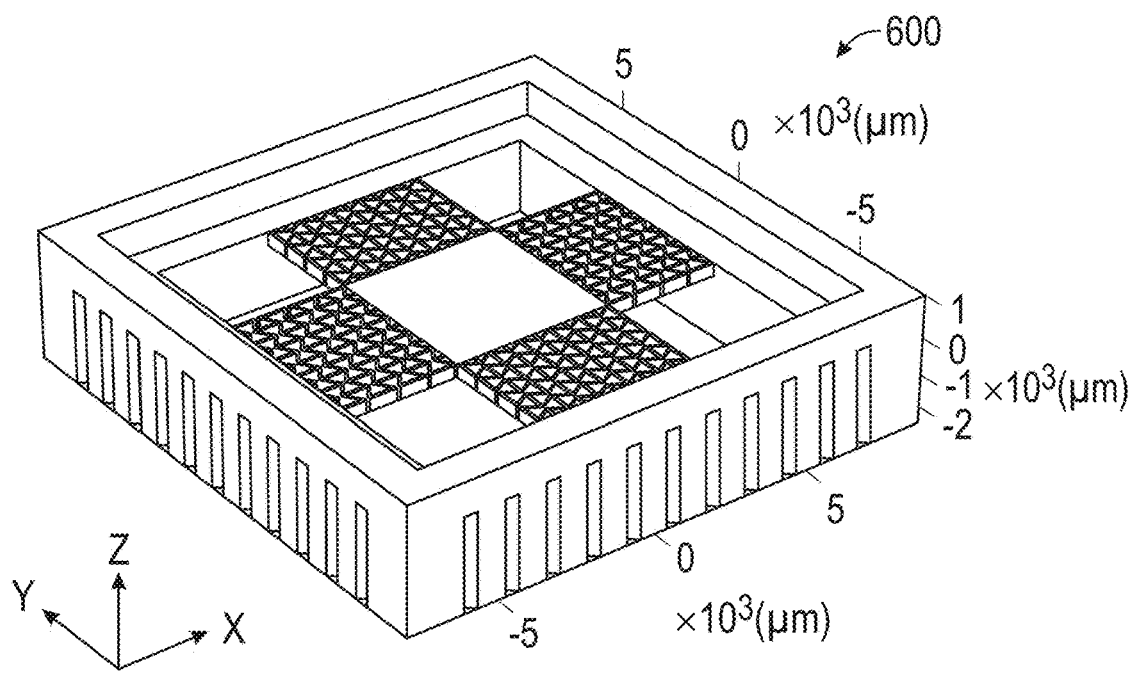
Figure 11C:
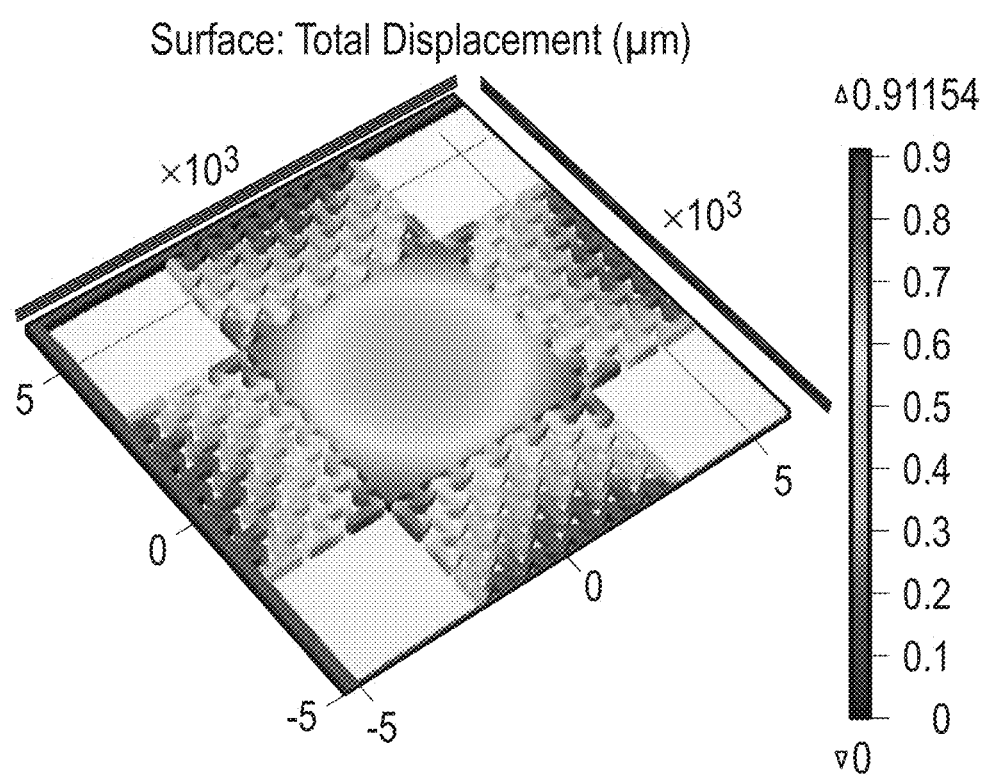
FIG. 11C is a graph showing surface displacement of the auxetic interposer shown in FIGS. 11A and 11B when partially ovenized.

FIGS. 11A and 11B show an auxetic interposer 600 according to an embodiment of the present invention having an M>N (e.g., 7×5) unit cell configuration, and FIG. 11C is a graph showing surface displacement of the auxetic interposer shown in FIGS. 11A and 11B when partially ovenized. Referring to FIG. 11C, maximum stress of the auxetic interposer according to an embodiment of the present invention is at the edge of the pad 140.1 and minimum stress and displacement is at the center of the pad 140.1. Thus, a minimum amount of stress is imparted to a MEMS device mounted on the pad 140.1 due to the micro auxetic lattices 140.2-140.5.

Figure 12A:
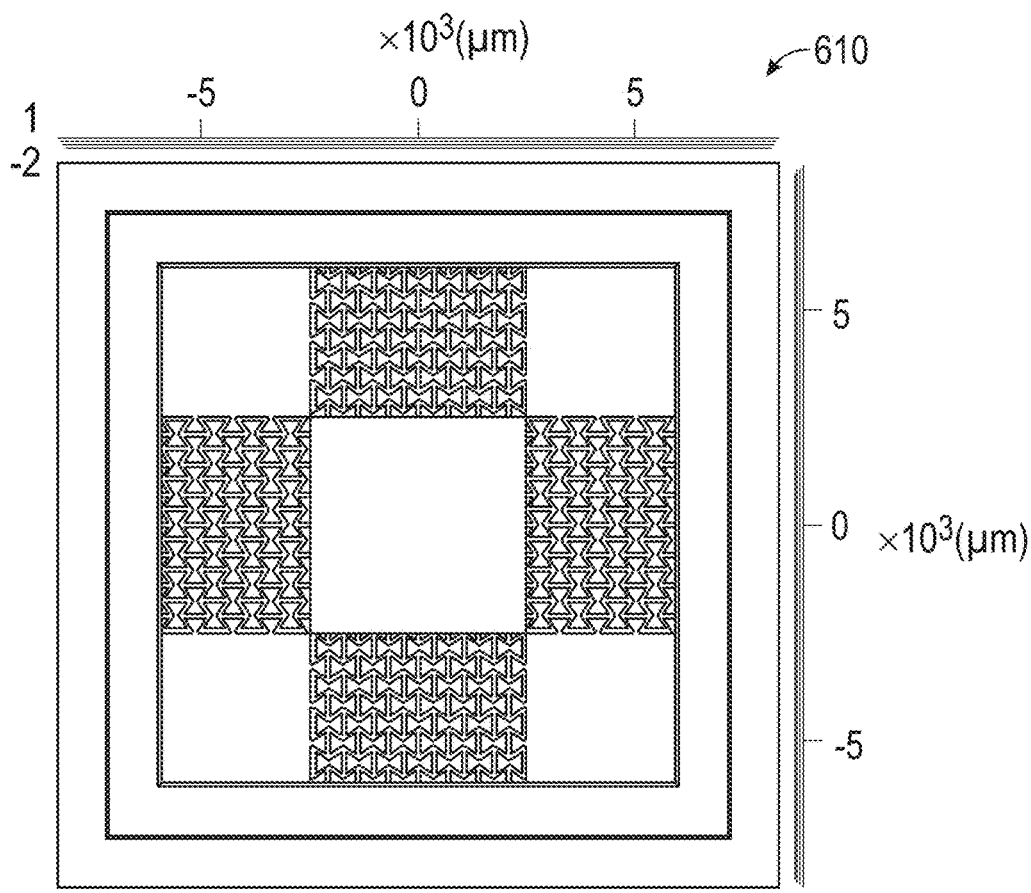
FIGS. 12A-13B show auxetic interposers according to embodiments of the present invention.
Figure 12B:
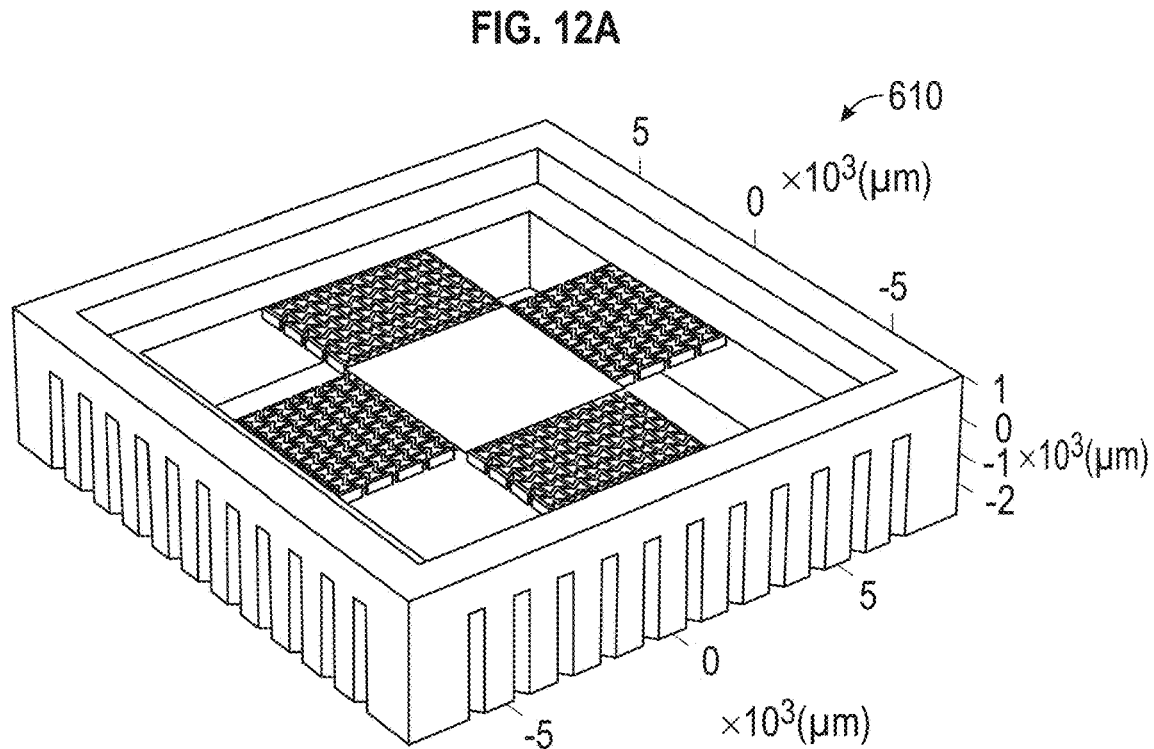
Figure 13A:
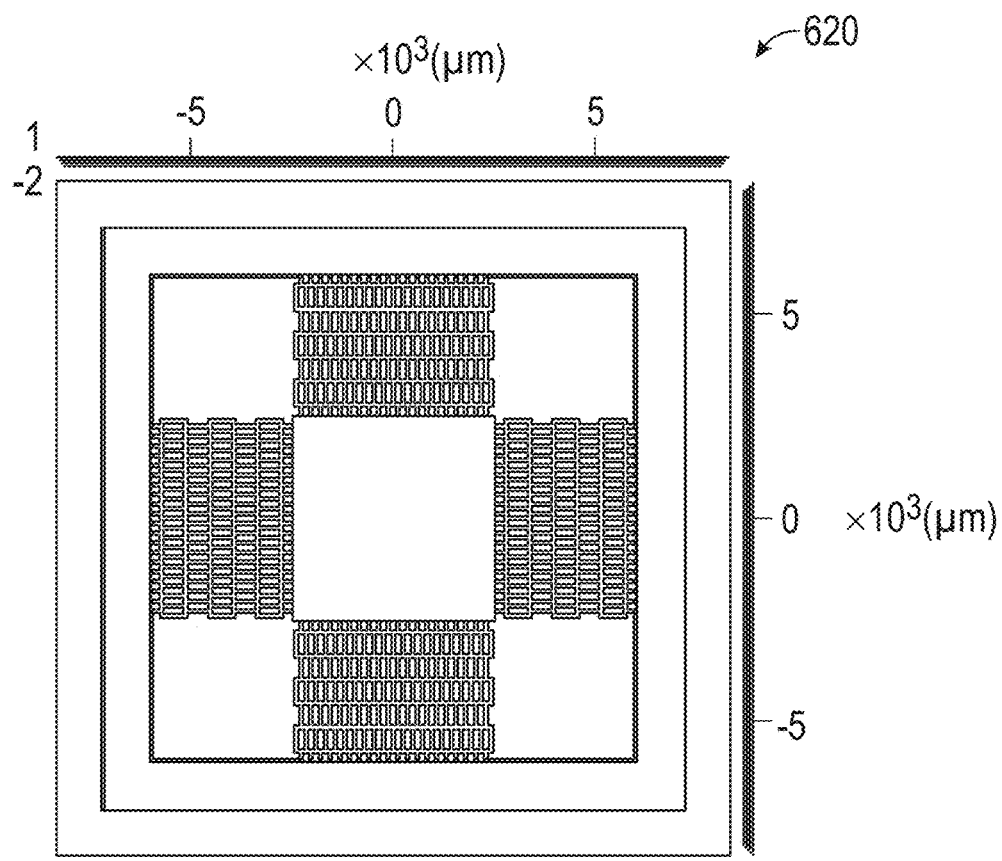
Figure 13B:
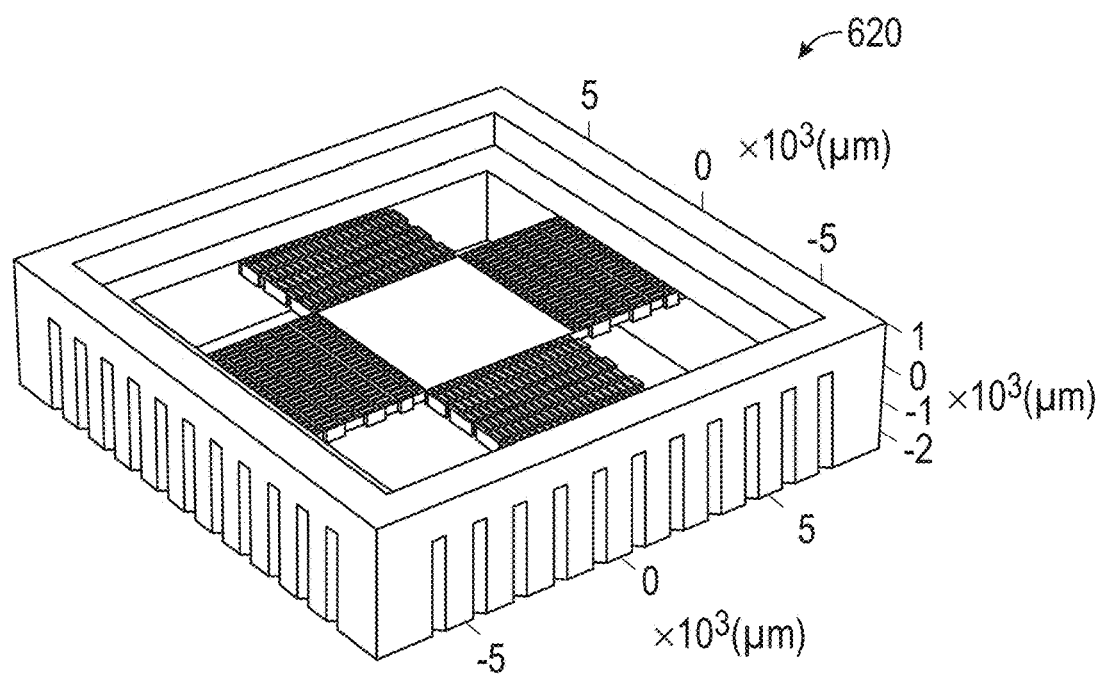

FIGS. 12A and 12B show an auxetic interposer 610 according to an embodiment of the present invention having an M=N (e.g., 7×7) unit cell configuration, and FIGS. 13A and 13B show an auxetic interposer 620 according to an embodiment of the present invention having an M<N (e.g., 5×7) unit cell configuration.

Figure 14:
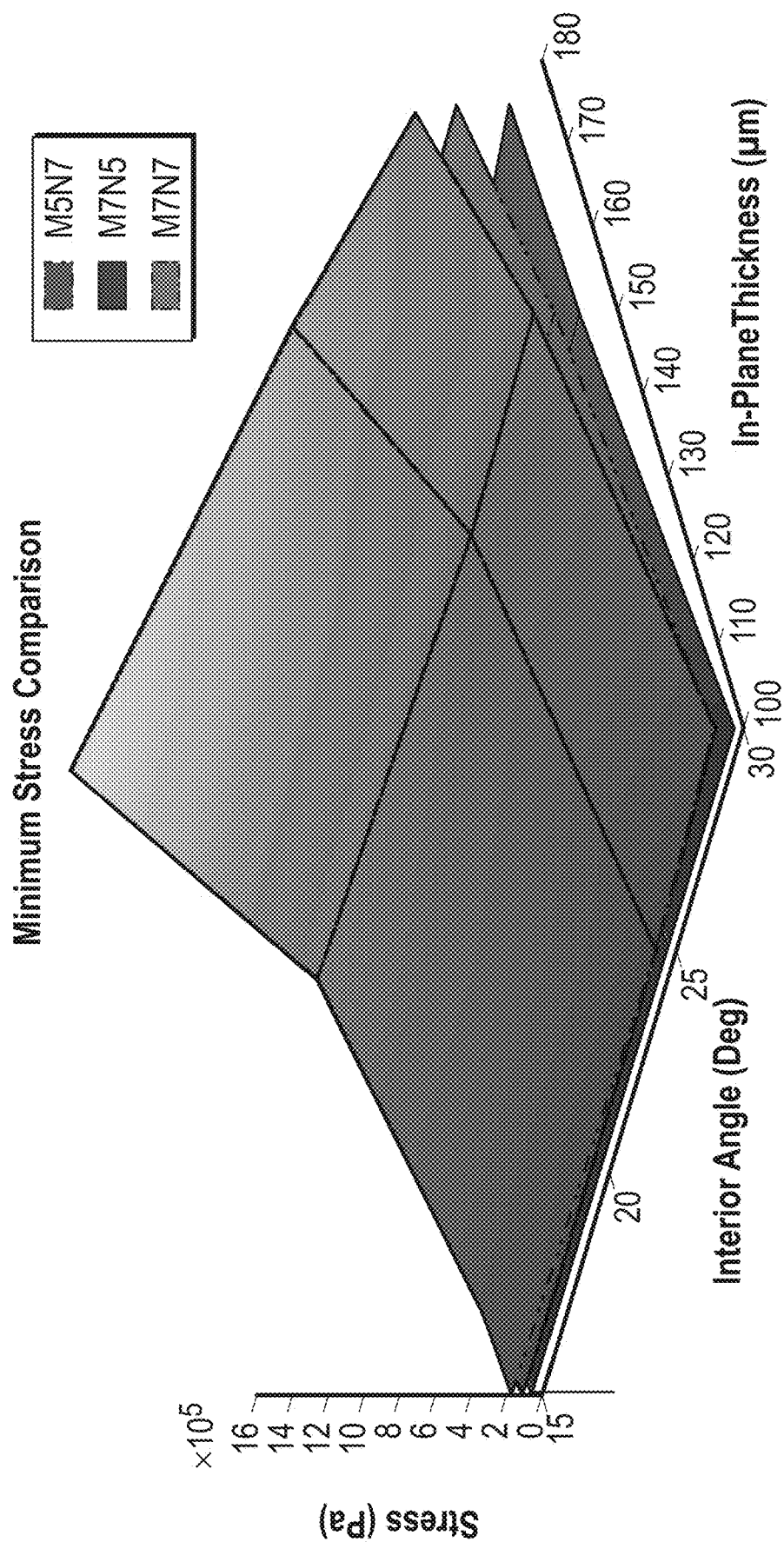
FIG. 14 is a graph showing minimum stress for different embodiments of auxetic interposers having various suitable in-plane thicknesses and interior angles.

FIG. 14 is a graph showing stress values of auxetic interposers having configurations similar to the auxetic interposers 600, 610, and 620 shown in FIGS. 11A-13B. The three different planes represent auxetic interposers having 5×7 (referenced as M5N7), 7×5 (referenced as M7N5), and 7×7 (M7N7) unit cell configurations and show minimum stress values according to interior angle (A) and in-plane wall thickness (t). The M>N unit cell configuration has the lowest overall stress from among the different unit cell configurations. Changing the interior angle (θ) has a relatively minor impact on overall stress at lower in-plane wall thicknesses (t) but has a relatively large impact at higher in-plane wall thicknesses (t). Larger interior angles (A) generally result in lower overall stress, and higher in-plane wall thicknesses (t) generally result in higher minimum stress But the increase in minimum stress due to increased in-plane wall thickness (t) is relatively small.

Figure 15A:
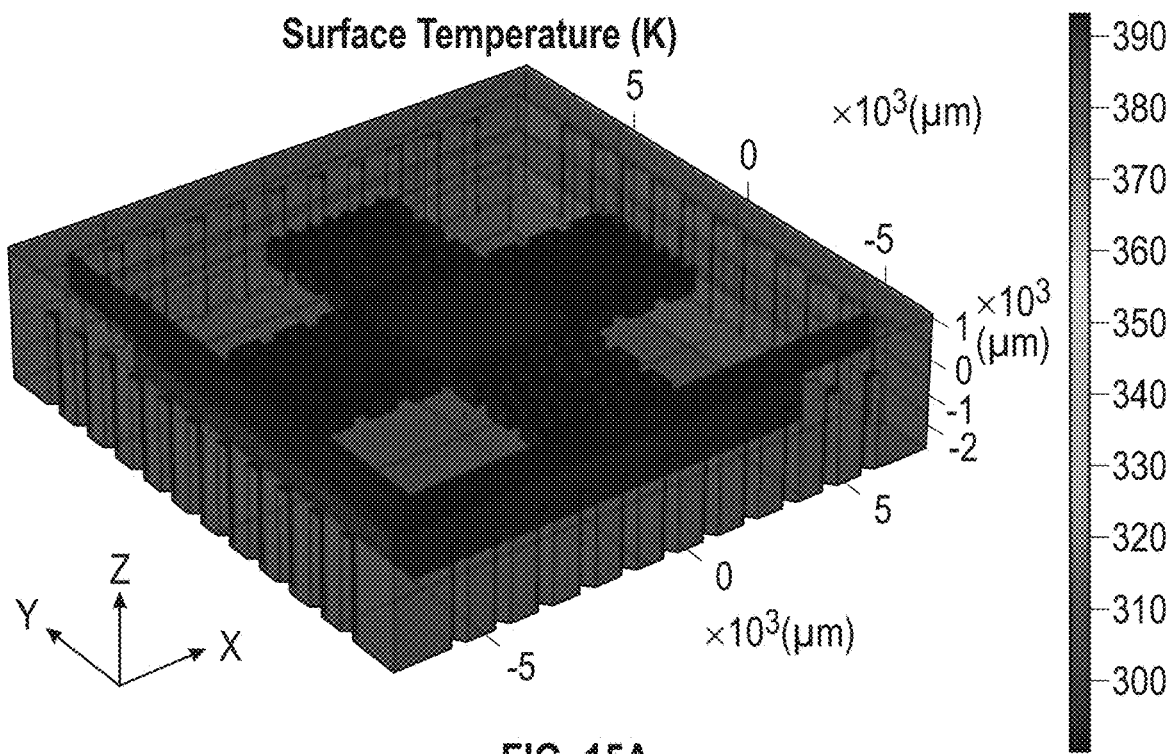
FIG. 15A shows surface temperature of an ovenized auxetic interposer according to an embodiment of the present invention.

FIG. 15A shows surface temperature a uniformly ovenized auxetic interposer according to an embodiment of the present invention to a relatively high temperature, such as over 300 K. Different from the partial ovenization shown in FIG. 11C, the example shown in FIG. 15A show uniform or relatively uniform ovenization which may occur when the entire package is heated due to, for example, an increase the ambient temperature of the external environment.

Figure 15B:
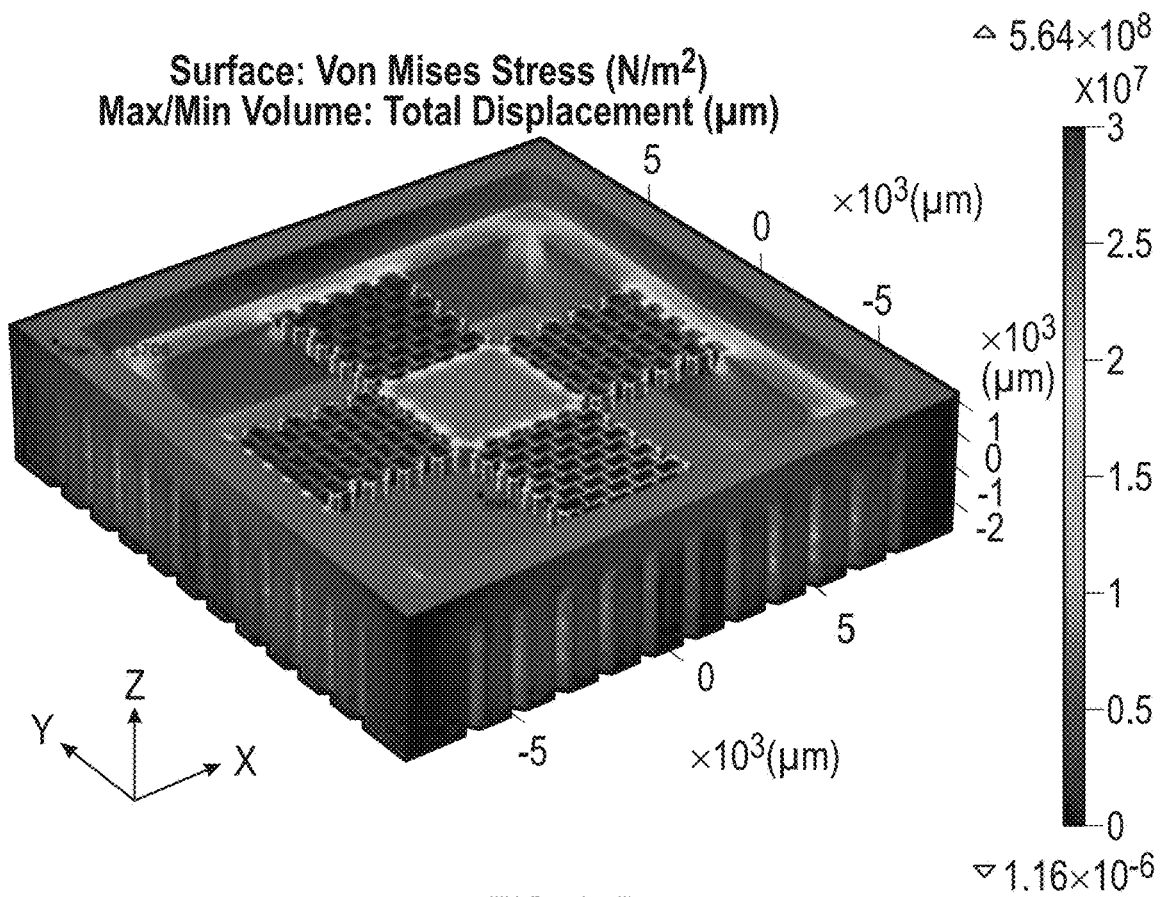
FIG. 15B shows displacement and Von Mises stress of the ovenized auxetic interposer shown in FIG. 15A.

FIG. 15B shows displacement and Von Mises stress of the auxetic interposer shown in FIG. 15A after uniform heating (e.g., uniform ovenization). As can be seen in FIG. 15B, the stress is concentrated primarily at the micro auxetic lattices while the pad is a relatively low stress area. Thus, the pad is evenly displaced by the micro auxetic lattices. Because the MEMS device is secured to the interposer at the pad, the MEMS device would be subjected to lower stress and would be more evenly displaced (e.g., not twisted or tilted) when attached to the auxetic interposer according to an embodiment of the present invention.

Figure 16A:
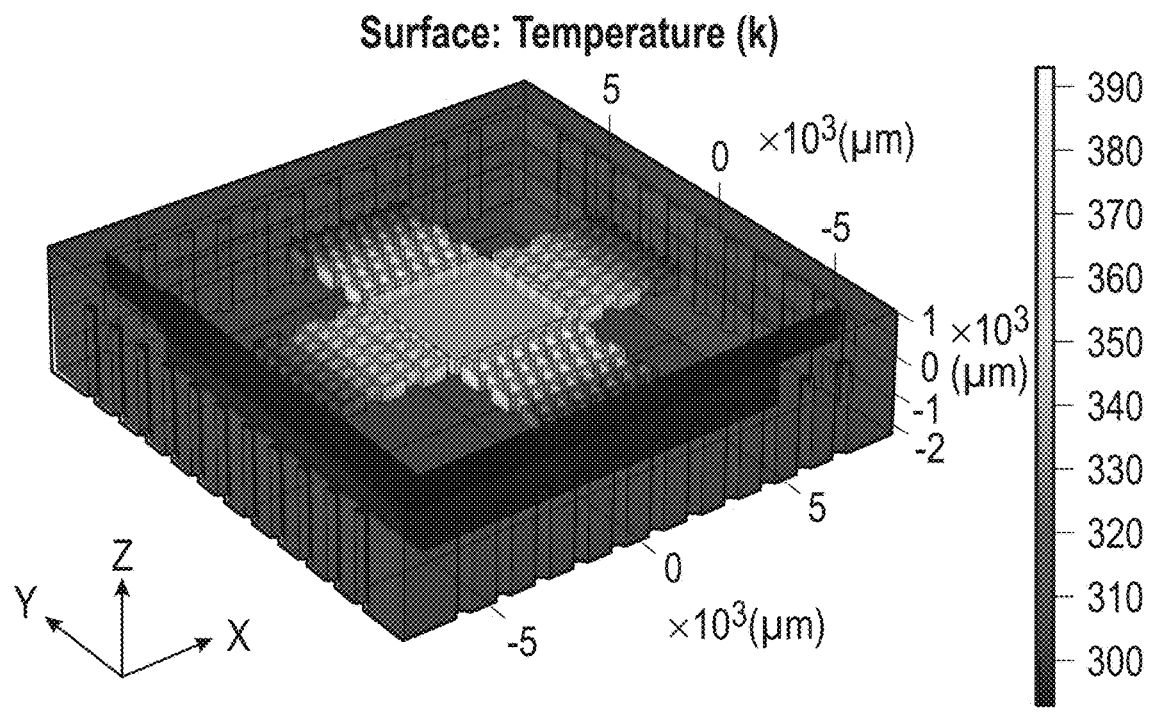
FIG. 16A shows surface temperature of a partially ovenized auxetic interposer according to an embodiment of the present invention.
Figure 16B:
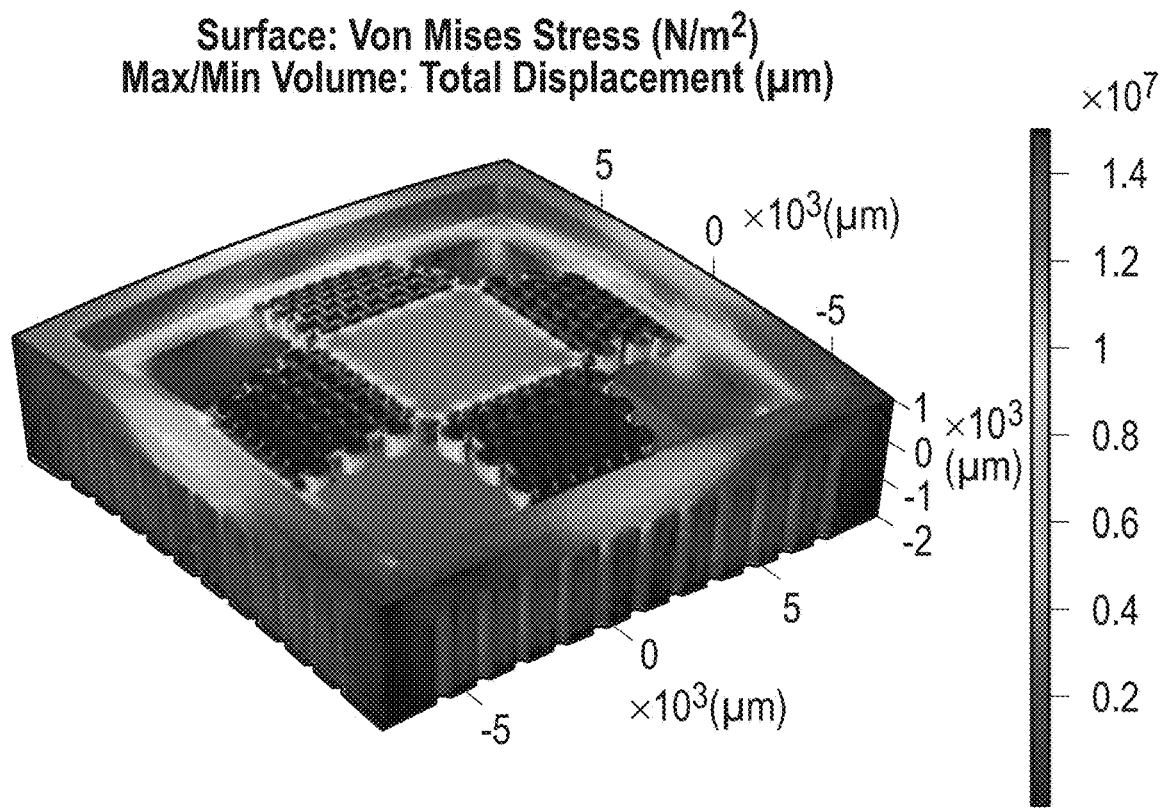
FIG. 16B shows displacement and Von Mises stress of the partially ovenized auxetic interposer shown in FIG. 16A.

FIG. 16A shows surface temperature of a partially ovenized auxetic interposer according to an embodiment of the present invention, similar the example shown in FIG. 11C. As can be seen in FIG. 16B, the pad of the auxetic interposer according to an embodiment of the present invention, when partially ovenized, maintains its orientation with respect to the package and, therefore, to the vehicle. Further, the pad of the auxetic interposer merely rises up to account for thermal expansion and does not, for example, twist. By evenly rising, very little or no thermal stress is imparted to the MEMS device on the pad of the auxetic interposer, thereby providing more accurate operation of the MEMS device.

It will be understood that, although the terms "first", "second", "third", etc., may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section, without departing from the spirit and scope of the inventive concept.

Spatially relative terms, such as "beneath", "below", "lower", "under", "above", "upper" and the like, may be used herein for ease of description to describe one element or feature's relationship to another element(s) or feature(s) as illustrated in the figures. It will be understood that such spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly. In addition, it will also be understood that when a layer is referred to as being "between" two layers, it can be the only layer between the two layers, or one or more intervening layers may also be present.

The terminology used herein is for the purpose of describing particular embodiments only and is not intended to be limiting of the inventive concept. As used herein, the terms "substantially," "about," and similar terms are used as terms of approximation and not as terms of degree, and are intended to account for the inherent deviations in measured or calculated values that would be recognized by those of ordinary skill in the art. As used herein, the term "major component" means a component constituting at least half, by weight, of a composition, and the term "major portion", when applied to a plurality of items, means at least half of the items.

As used herein, the singular forms "a" and "an" are intended to include the plural forms as well, unless the context clearly indicates otherwise. It will be further understood that the terms "comprises" and/or "comprising", when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Expressions such as "at least one of," when preceding a list of elements, modify the entire list of elements and do not modify the individual elements of the list. Further, the use of "may" when describing embodiments of the inventive concept refers to "one or more embodiments of the present invention". Also, the terms "exemplary" and "example" are intended to refer to an example or illustration. As used herein, the terms "use," "using," and "used" may be considered synonymous with the terms "utilize," "utilizing," and "utilized," respectively.

It will be understood that when an element or layer is referred to as being "on", "connected to", "coupled to", or "adjacent to" another element or layer, it may be directly on, connected to, coupled to, or adjacent to the other element or layer, or one or more intervening elements or layers may be present. In contrast, when an element or layer is referred to as being "directly on", "directly connected to", "directly coupled to", or "immediately adjacent to" another element or layer, there are no intervening elements or layers present.

Any numerical range recited herein is intended to include all sub-ranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein and any minimum numerical limitation recited in this specification is intended to include all higher numerical limitations subsumed therein.

Although example embodiments of a mechanical interposer having an auxetic structure and a MEMS device package including the same have been described and illustrated herein, many modifications and variations within those embodiments will be apparent to those skilled in the art. Accordingly, it is to be understood that a mechanical interposer having an auxetic structure and a MEMS device package including the same according to the present invention may be embodied in forms other than as described herein without departing from the spirit and scope of the present invention. The present invention is defined by the following claims and equivalents thereof.

What is claimed is:

1. An auxetic interposer comprising:
   a frame enclosing an interior space;
   a pad arranged within the interior space; and
   a plurality of micro auxetic lattices extending between the frame and the pad.

2. The auxetic interposer of claim 1, wherein the frame has an open quadrilateral shape.

3. The auxetic interposer of claim 2, wherein the pad and the micro auxetic lattices are spaced from a plane formed by a bottom surface of the frame.

4. The auxetic interposer of claim 3, wherein the pad and the micro auxetic lattices are suspended from interior edges of the frame.

5. The auxetic interposer of claim 1, wherein each of the micro auxetic lattices comprises a plurality of unit cells arranged in a matrix, the matrix being defined by a number of columns extending in a height direction from the pad to the frame and by a number of rows extending in a width direction perpendicular to the height direction, and
   wherein the number of rows of unit cells is greater than the number of columns of unit cells.

6. The auxetic interposer of claim 5, wherein each of the unit cells has a hexagonal shape.

7. The auxetic interposer of claim 6, wherein the hexagonal shape is a bowtie shape having an interior angle in a range of about 10° to about 45°.

8. The auxetic interposer of claim 5, wherein a thickness of each of the micro auxetic lattices in a direction perpendicular to height direction and the width direction is about 500 μm.

9. A microelectromechanical systems (MEMS) device package comprising:
   a package;
   a lid sealing an opening in the package;
   a MEMS device in an area between the package and the lid; and
   an auxetic interposer coupled to both the package and the MEMS device.

10. The MEMS device package of claim 9, wherein the package is a leadless chip carrier.

11. The MEMS device package of claim 10, wherein the auxetic interposer comprises a frame, a pad, and a plurality of micro auxetic lattices coupling the pad to the frame, and wherein the MEMS device is mounted to the pad.

12. The MEMS device package of claim 11, wherein each of the micro auxetic lattices comprises a plurality of unit cells arranged in a matrix having more rows than columns, the columns extending in a height direction from the pad to the frame, the rows extending in a width direction perpendicular to the height direction.

13. The MEMS device package of claim 11, wherein the frame is a quadrilateral shape frame, and
    wherein the micro auxetic lattices are coupled to respective sides of the frame in a one-to-one configuration.

14. The MEMS device package of claim 11, wherein the auxetic interposer comprises a plurality of electrical connections,
    wherein the package comprises a plurality of pads, and
    wherein the auxetic interposer is arranged on the pads.

15. A system comprising a microelectromechanical systems (MEMS) device coupled to an auxetic interposer, the auxetic interposer comprising:
    a frame having a closed periphery;
    a plurality of micro auxetic lattices coupled to the frame and in the closed periphery; and
    a pad coupled to the frame via the micro auxetic lattices, the MEMS device being coupled to the pad.

16. The system of claim 15, wherein the MEMS device comprises an accelerometer.

17. The system of claim 15, wherein the micro auxetic lattices each comprises a plurality of bowtie-shaped unit cells.

18. The system of claim 17, wherein the pad is suspended above a bottom of the auxetic interposer by the micro auxetic lattices.

19. The system of claim 18, wherein bowtie-shaped unit cells are arranged in a matrix form having rows extending in a first direction and columns extending in a second direction.

20. The system of claim 19, wherein the bowtie-shaped unit cells in one row of the matrix form are offset with respect to the bowtie-shaped unit cells in an adjacent row of the one row of the matrix form in the first direction.

* * * * *